United States Patent
Hirakawa

(10) Patent No.: US 10,976,721 B2
(45) Date of Patent: Apr. 13, 2021

(54) INFORMATION PROCESSING APPARATUS, METHOD, AND MEDIUM TO GENERATE MANAGEMENT THREE-DIMENSIONAL MODEL DATA

(71) Applicant: CANON KABUSHIKI KAISHA, Tokyo (JP)

(72) Inventor: Satoshi Hirakawa, Fuchu (JP)

(73) Assignee: Canon Kabushiki Kaisha, Tokyo (JP)

( * ) Notice: Subject to any disclaimer, the term of this patent is extended or adjusted under 35 U.S.C. 154(b) by 37 days.

(21) Appl. No.: 15/710,685

(22) Filed: Sep. 20, 2017

(65) Prior Publication Data
US 2018/0095449 A1 Apr. 5, 2018

(30) Foreign Application Priority Data
Sep. 30, 2016 (JP) .............................. JP2016-193046

(51) Int. Cl.
G05B 19/4099 (2006.01)
B33Y 50/00 (2015.01)
G06F 30/00 (2020.01)
B33Y 50/02 (2015.01)
B29C 64/393 (2017.01)

(52) U.S. Cl.
CPC ........ G05B 19/4099 (2013.01); B29C 64/393 (2017.08); B33Y 50/00 (2014.12); B33Y 50/02 (2014.12); G06F 30/00 (2020.01); G05B 2219/35134 (2013.01); G05B 2219/49007 (2013.01)

(58) Field of Classification Search
USPC ........................................................ 345/420
See application file for complete search history.

(56) References Cited

U.S. PATENT DOCUMENTS

| | | | |
|---|---|---|---|
| 2014/0058959 A1* | 2/2014 | Isbjornssund | G06F 21/10 705/310 |
| 2014/0156053 A1* | 6/2014 | Mahdavi | H04L 63/08 700/119 |
| 2016/0180061 A1* | 6/2016 | Pogorelik | G06F 21/10 713/189 |
| 2016/0259306 A1* | 9/2016 | Pangrazio, III | H04L 9/3247 |

FOREIGN PATENT DOCUMENTS

| | | |
|---|---|---|
| CN | 101489073 A | 7/2009 |
| CN | 104608380 A | 5/2015 |
| CN | 105599307 | 5/2016 |
| JP | 2016-036993 A | 3/2016 |
| JP | 2016170488 A | 9/2016 |
| JP | 2016072352 A1 | 8/2017 |
| WO | 2016/072352 A1 | 5/2016 |

* cited by examiner

*Primary Examiner* — Shivang I Patel
(74) *Attorney, Agent, or Firm* — Canon U.S.A., Inc. IP Division

(57) ABSTRACT

A reading device generates a data package which includes model data available for modeling a three-dimensional object and attribute information associated with the model data. The attribute information includes identification information about the model data and information about a reading function of generating data which indicates a three-dimensional structure of the object.

14 Claims, 13 Drawing Sheets

FIG.13

CONFIRMATION

DATA YOU ARE TRYING TO USE FOR MODELING IS SCAN DATA GENERATED BY READING DEVICE.
APPROXIMATE DATA FOR THIS SCAN DATA IS PRESENT IN SERVER.
DO YOU REPLACE SCAN DATA WITH APPROXIMATE DATA FOR MODELING?

YES (Y)    NO (N)

INFORMATION PROCESSING APPARATUS, METHOD, AND MEDIUM TO GENERATE MANAGEMENT THREE-DIMENSIONAL MODEL DATA

BACKGROUND

Field of the Disclosure

The present disclosure generally relates to information processing and, more particularly, to an information processing apparatus, method, medium, and a technology for managing model data available for modeling a three-dimensional (3D) model object.

Description of the Related Art

In recent years, a modeling device (e.g., a 3D printer) has been widely used for producing a three-dimensional model object. Model data used for printing by a 3D printer may be acquired from a web service downloaded at a price- or free of charge. Alternatively, model data for modeling a three-dimensionally object may be acquired from a reading device (e.g., a 3D scanner) which reads a real object as a three-dimensional object. Accordingly, a user is now capable of acquiring 3D model data for desired modeling more easily, and modeling an object based on the acquired data more freely.

Under the circumstances described above, copyrighted objects or dangerous objects may be also freely copied or modeled. Japanese Patent Application Laid-Open No. 2016-36993 discusses a technology which collates 3D model data for modeling and 3D model data in a model database (DB) provided for regulation of dangerous objects, and regulates output of the 3D model data when the 3D model data is determined as a regulation target.

On the other hand, there is a case where copying or the like of three-dimensional objects may be allowed unconditionally or under particular conditions. Even in these cases, specific situations such as a distribution amount and a frequency of use (number of times of use) of copying data, and a copying route and a degree of accuracy of copying need to be recognized. However, no systems for recognizing these situations are currently established. In addition, modeling data which does not express details may be distributed when a 3D scanner is not accurate in performance, for example. In this case, an inaccurate model object may be output.

SUMMARY

One or more aspects of the present disclosure is an information processing apparatus including one or more memories storing instructions and one or more processors which, when executing the instructions, causes the information processing apparatus to generate management model data which includes model data available for modeling a three-dimensional object and attribute information associated with the model data, wherein the attribute information includes identification information about the model data and information related to a reading function of generating data which indicates a three-dimensional structure of the object.

Further features of the present disclosure will become apparent from the following description of exemplary embodiments with reference to the attached drawings.

BRIEF DESCRIPTION OF THE DRAWINGS

FIG. 13 is a confirmation window for checking whether to replace 3D model data with approximate data for modeling according to one or more aspects of the present disclosure.

DESCRIPTION OF THE EMBODIMENTS

Exemplary embodiments according to one or more aspects of the present disclosure are hereinafter described with reference to the drawings.

Figure 1:
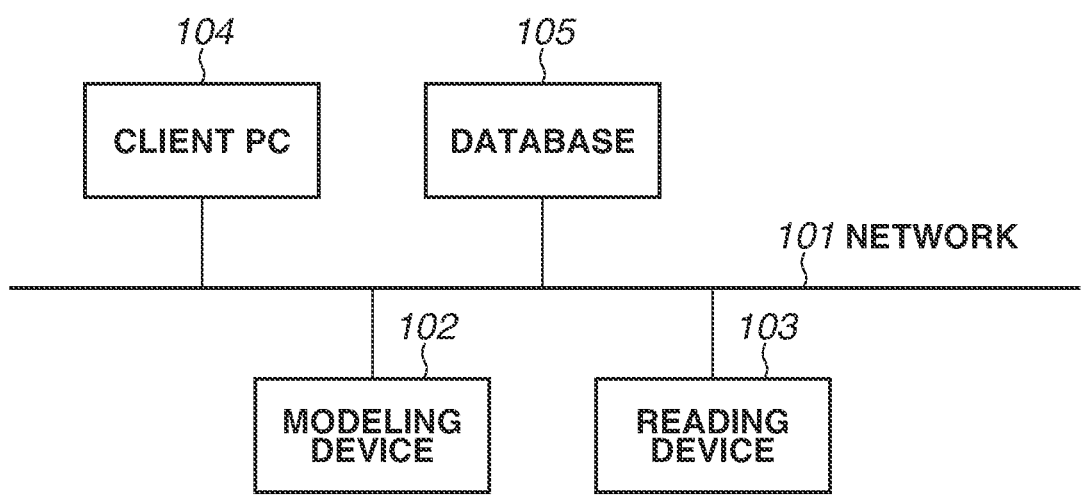
FIG. 1 is a general configuration diagram of a modeling system according to one or more aspects of the present disclosure.

FIG. 1 is a diagram illustrating a general configuration of a modeling system according to a first exemplary embodiment.

As illustrated in FIG. 1, the modeling system according to the present exemplary embodiment constitutes a network system which includes a modeling device 102, a reading device 103, a client personal computer (PC) 104, and a database (DB) 105.

A network 101 is an intranet, a local area network (LAN), or a network of other types. The modeling device 102 is a three-dimensional printer (3D printer) which prints (models) a three-dimensionally model object. The reading device 103 is a three-dimensional scanner (3D scanner) which reads a three-dimensionally real object and generates 3D model data.

The client PC 104 is a computer such as a personal computer, a tablet-type computer, or a smartphone. The DB 105 is a computer which constitutes an external system storing three-dimensional model data for the modeling carried out by the modeling device 102, and managing the three-dimensional model data.

The modeling device 102, the reading device 103, the client PC 104, and the DB 105 are capable of performing mutual communication for transmission and reception of information via the network 101. The network 101 may be a wireless network such as a wireless LAN. In addition, the network 101 may be a public network such as the Internet as long as the transmission and reception of information is achievable via the network.

Figure 2:
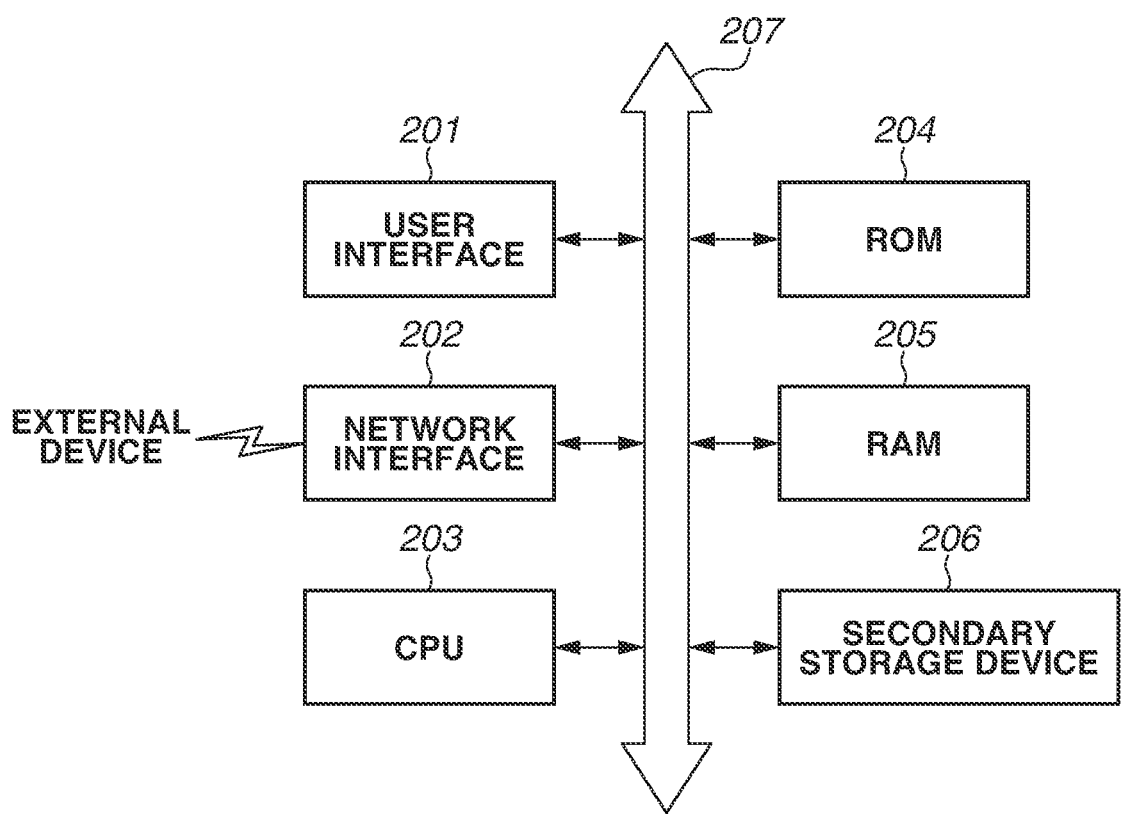
FIG. 2 is a hardware module configuration diagram of information processing functions included in each of devices according to one or more aspects of the present disclosure.

FIG. 2 is a diagram illustrating an example of a hardware module configuration of information processing functions of each of the modeling device 102, the reading device 103, the client PC 104, and the DB 105. This figure illustrates only the information processing functions. However, in practical cases, each of the modeling device 102, the reading device 103, the client PC 104, and the DB 105 includes other hardware.

A user interface (UI) 201 is an interface for input and output of information and signals, and provided in such a form as a display, a keyboard, a mouse, a touch panel, and a button. A computer not including these forms of hardware may be connected to and operated by other computers using remote desktop or remote shell.

A network interface 202 is connected to a network such as a LAN to perform communication with other computers or network devices.

A central processing unit (CPU) 203, which may include one or more processors and one or more memories, executes programs read from a read only memory (ROM) 204, a random access memory (RAM) 205, and a secondary storage device 206. The ROM 204 records preloaded programs and data, for example. The RAM 205 is a temporary memory area. The secondary storage device 206 is a secondary storage device represented by a hard disk drive (HDD) or a flash memory.

The respective units 201 through 206 described above are connected to each other via an input/output interface 207.

The units described throughout the present disclosure are exemplary and/or preferable modules for implementing processes described in the present disclosure. The modules can be hardware units (such as circuitry, a field programmable gate array, a digital signal processor, an application specific integrated circuit or the like) and/or software modules (such as a computer readable program or the like). The modules for implementing the various steps are not described exhaustively above. However, where there is a step of performing a certain process, there may be a corresponding functional module or unit (implemented by hardware and/or software) for implementing the same process. Technical solutions by all combinations of steps described and units corresponding to these steps are included in the present disclosure.

A configuration of software described in the present exemplary embodiment is realized under programs recorded in the ROM 204, loaded to the RAM 205, and executed by the CPU 203.

Figure 3:
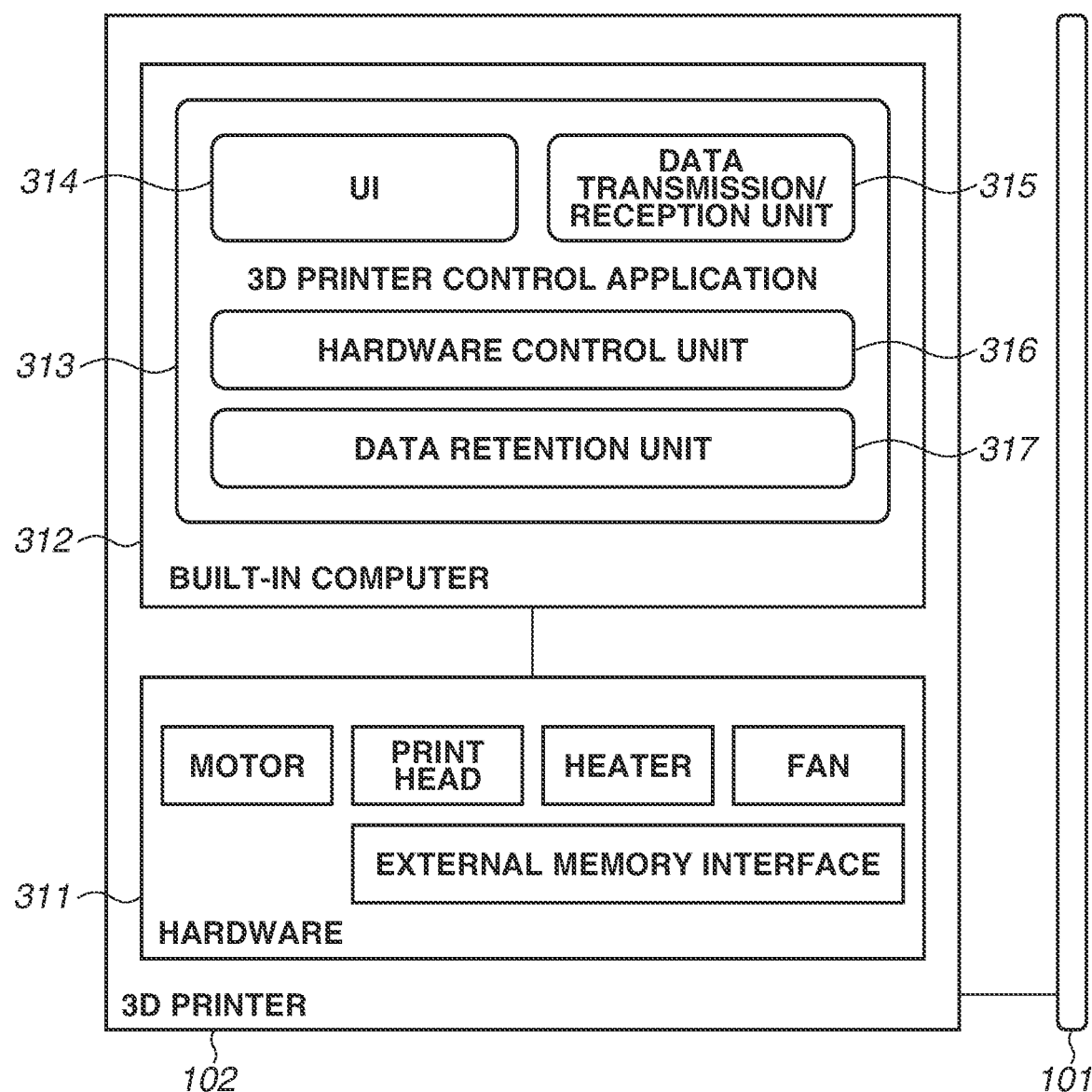
FIG. 3 is a diagram illustrating an example of a software configuration and a part of a hardware configuration of a modeling device according to one or more aspects of the present disclosure.

FIG. 3 is a diagram illustrating an example of a software configuration and a part of a hardware configuration of the modeling device 102.

A hardware unit 311 in FIG. 3 is a hardware unit of the modeling device 102. The hardware constituting the modeling device 102 varies according to a technology used in a manufacturing. In a case of fused deposition modeling (FDM), for example, the hardware of the modeling device 102 includes a motor which drives a print head and a stage print head in directions of x, y, and z axes, a heater which heats a nozzle of the print head, and a fan for cooling. The hardware of the modeling device 102 further includes an external memory interface for an external memory such as a universal serial bus (USB) memory.

A built-in computer 312 is a computer incorporated in the modeling device 102. The built-in computer 312 does not have unnecessary functions, performance, and parts, but only performs necessary functions. Accordingly, manufacturing costs of the built-in computer 312 is lower than manufacturing costs of a general-purpose computer. However, the built-in computer 312 may be a general-purpose computer depending on functions and performance desired for the modeling device 102. The built-in computer 312 has the hardware configuration illustrated in FIG. 2, for example.

A modeling device control application (3D printer control application) 313 is an application executed by the built-in computer 312. The modeling device control application 313 includes a UI 314, a data transmission/reception unit 315, a hardware control unit 316, and a data retention unit 317. More specifically, the UI 314, the data transmission/reception unit 315, the hardware control unit 316, and the data retention unit 317 are realized (perform functions) employing the modeling device control application 313 stored in the ROM 204 and executed by the CPU 203 included in the built-in computer 312 of the modeling device 102.

The UI 314 may be an inexpensive unit which includes a combination of a liquid crystal display (LCD) presenting only several lines of characters and hardware operation buttons, or may be an LCD equipped with a touch panel, for example. The user checks a state of the modeling device 102 based on display contents of the UI 314, and operates the UI 314 to issue a command of a desired process to the modeling device 102.

The data transmission/reception unit 315 transmits and receives commands and data to and from the external client PC 104.

The hardware control unit 316 operates the respective units of the hardware unit 311 based on commands received via the UI 314 and the data transmission/reception unit 315, and commands issued from the modeling device control application 313, to output a model object, and perform preprocessing and post-processing of the output, for example.

The data retention unit 317 retains various types of data in a secondary storage device of the built-in computer 312. Information retained by the data retention unit 317 includes a modeling device ID which uniquely identifies a corresponding modeling device, and address information which indicates an address of the DB 105 used for accessing the DB 105 at the time of checking whether modeling based on 3D model data is permitted.

Figure 4:
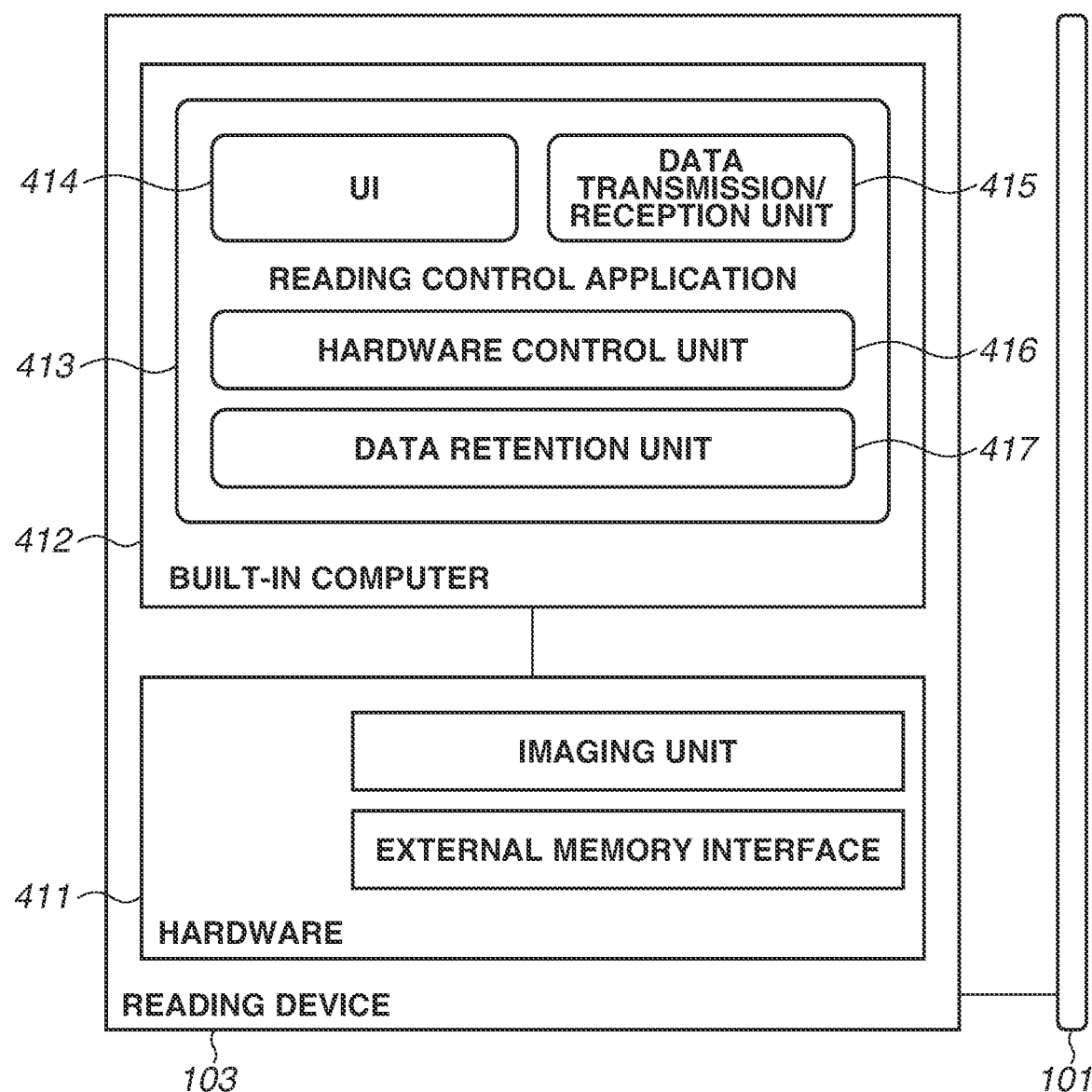
FIG. 4 is a diagram illustrating an example of a software configuration and a part of a hardware configuration of a reading device according to one or more aspects of the present disclosure.

FIG. 4 is a diagram illustrating an example of a software configuration and a part of a hardware configuration of the reading device 103.

A hardware unit 411 in FIG. 4 is a hardware unit of the reading device 103. The hardware of the reading device 103 includes an imaging unit which captures videos and images, and an external memory interface for an external memory such as a USB memory.

A built-in computer 412 is a computer incorporated in the reading device 103. The built-in computer 412 does not have unnecessary functions, performance, and parts, but only performs necessary functions. Accordingly, manufacturing costs of the built-in computer 412 is lower than manufacturing costs of a general-purpose computer. However, the built-in computer 412 may be a general-purpose computer depending on functions and performance desired for the reading device 103. The built-in computer 412 has the hardware configuration illustrated in FIG. 2, for example.

A reading control application 413 is an application executed by the built-in computer 412. The reading control application 413 includes a UI 414, a data transmission/reception unit 415, a hardware control unit 416, and a data retention unit 417. More specifically, the UI 414, the data transmission/reception unit 415, the hardware control unit 416, and the data retention unit 417 are realized (perform functions) employing the reading control application 413 stored in the ROM 204 and executed by the CPU 203 included in the built-in computer 412 of the reading device 103.

The data transmission/reception unit 415 transmits and receives commands and data to and from the external client PC 104. The hardware control unit 416 operates the hardware unit 411 based on commands received via the UI 414 and the data transmission/reception unit 415, and commands issued from the reading control application 413 to image and capture an object. The reading control application 413 converts captured data into 3D model data, and stores the data in a memory connected via an external memory interface, or in the secondary storage device 206 of the external client PC 104. Alternatively, the imaging data may be transmitted to the external client PC 104 without conversion into 3D model data, and then converted into 3D model data by the client PC 104.

The data retention unit 417 retains various types of data in a secondary storage device of the built-in computer 412 (e.g., secondary storage device 206 of reading device 103). The retained information includes a reading device ID uniquely identifying the reading device 103.

Figure 5:
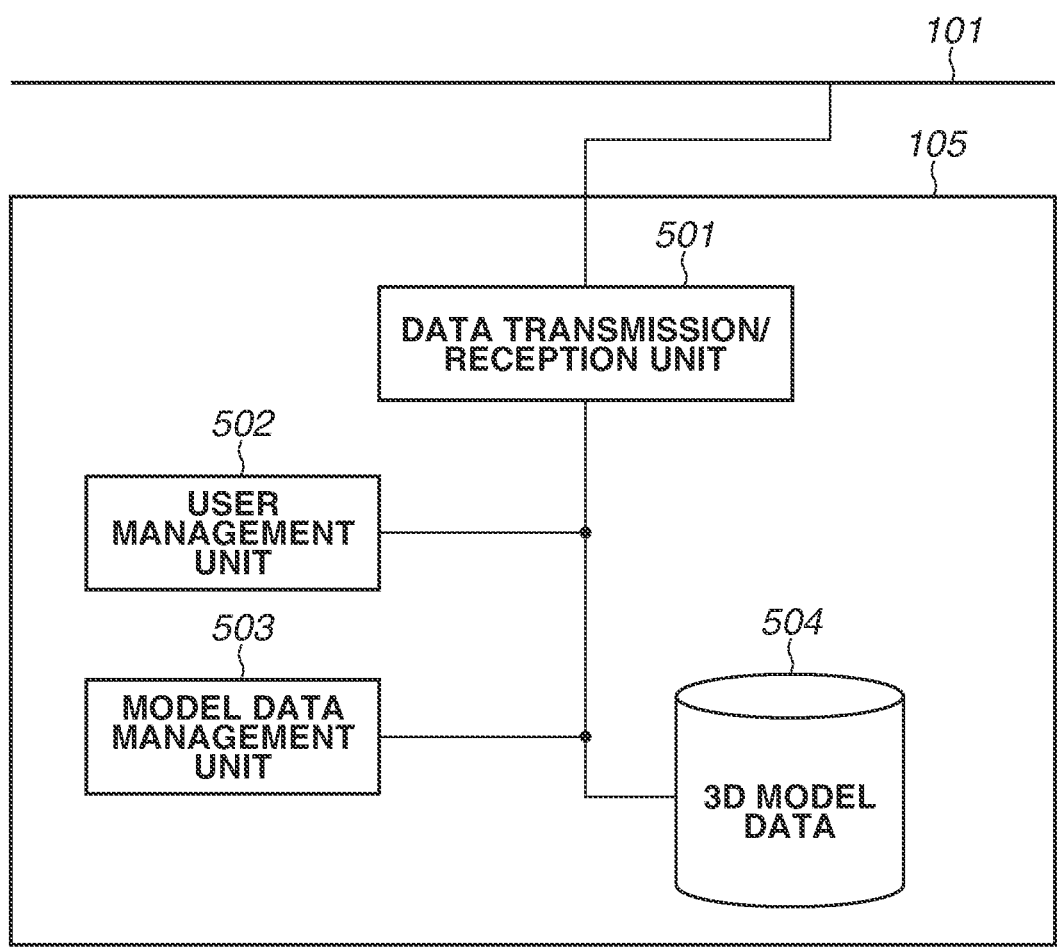
FIG. 5 is a diagram illustrating an example of a software configuration of a database according to one or more aspects of the present disclosure.

FIG. 5 is a diagram illustrating an example of a software configuration of the DB 105.

As illustrated in FIG. 5, software of the DB 105 includes a data transmission/reception unit 501, a user management unit 502, and a model data management unit 503. More specifically, the data transmission/reception unit 501, the user management unit 502, and the model data management unit 503 are realized (perform functions) employing programs stored in the secondary storage device 206 and executed by the CPU 203 included in the DB 105.

The data transmission/reception unit 501 transmits and receives various types of information to and from the modeling device 102, the reading device 103, and the client PC 104.

The user management unit 502 manages information about users using the DB 105.

The model data management unit 503 manages model data used for modeling by the modeling device 102, and attribute information associated with each model data. The model data management unit 503 further manages modeling permit information indicating permission of modeling based on 3D model data received from the modeling device 102 or the client PC 104, and permit information about the 3D model data.

3D model data 504 is entity data corresponding to 3D model data managed by the model data management unit 503. The 3D model data 504 is managed in association with attribute information managed by the model data management unit 503, and user information managed by the user management unit 502. For example, the 3D model data 504 is stored in the secondary storage device 206 of the DB 105.

Respective items of data managed by the user management unit 502 and the model data management unit 503 are hereinafter described with reference to a table.

Table 1 is an example table of user information managed by the user management unit 502.

TABLE 1

| USER ID | PASSWORD | MODELING DEVICE ID | READING DEVICE ID |
|---|---|---|---|
| U00001 | xxxxxxxx | P00001 | S00001 |
| U00002 | xxxxxxxx | P00002 | — |
|  |  | P00003 |  |
| . . . | . . . | . . . | . . . |

According to the present exemplary embodiment, a user is an owner of the modeling device 102 or the reading device 103. The user is a person who operates the modeling device 102 to execute modeling, or operates the reading device 103 to generate 3D model data.

In Table 1, an item "user ID" indicates an identifier (ID) uniquely identifying the user. An item "password" is a character string known only by the user.

An item "modeling device ID" is an ID uniquely identifying the modeling device 102. An item "reading device ID" is an ID uniquely identifying the reading device 103. Accordingly, Table 1 indicates the modeling device 102 or the reading device 103 owned and used by the user identified by the "user ID". When no description of the modeling device ID or the reading device ID is given, it is assumed that the corresponding user is not registered in the user management unit 502, or does not own the modeling device 102 or the reading device 103.

Table 2 is an example table of attribute information about 3D model data managed by the model data management unit 503.

TABLE 2

| MODEL ID | DB ADDRESS | READING FLAG | CENTER POSITION | IMAGING DISTANCE | LIGHT SOURCE POSITION | FRONT POSITION |
|---|---|---|---|---|---|---|
| M0001 | http://xxx | FALSE | (x1, y1, z1) | — | — | (xf1, yf1, zf1) |
| M0002 | http://xxx | FALSE | (X2, y2, z2) | — | — | (xf2, yf2, zf2) |
| M0003 | http://yyy | TRUE | (x3, y3, z3) | 50 | (x13, y13, z13) | (xf3, yf3, zf3) |
| . . . | . . . | . . . | . . . | . . . | . . . | . . . |

Respective items of attribute information about each 3D model data indicated in Table 2 may be retained in corresponding 3D model data as attribute information. In addition, attribute information may further include service provider information indicating a provider of corresponding 3D model data.

In Table 2, an item "model ID" is an identifier uniquely identifying 3D model data.

An item "DB address" is an Internet address of the DB 105 which manages the 3D model data identified by the "model ID". The modeling device 102 or the client PC 104 inquires of the DB 105 at the DB address about whether modeling based on the 3D model data is permitted. Details of the exemplary embodiment will be described below.

An item "reading flag" is an identifier indicating whether the 3D model data identified by "model ID" is generated by the reading device 103 ("TRUE" in this case), or not ("FALSE" in this case).

Each of items "center position", "imaging distance", "light source position", and "front position" indicates a feature value associated with a three-dimensional structure of corresponding 3D model data, and is referred to in checking approximate data described below. Each of these items is hereinafter described in detail.

The item "center position" is a coordinate position indicating the center of the 3D model data identified by the "model ID".

The item "imaging distance" indicates a distance between the reading device 103 and a model object when the model object is read by the reading device 103. This value corresponds to a distance between the imaging unit of the reading device 103 and the center position of the model object.

The item "light source position" indicates a coordinate position which represents a relative position of a light source with respect to the reading device 103 when the model object is read by the reading device 103. Each of the items "imaging distance" and "light source position" of the attribute information described above is effective for 3D model data generated by the reading device 103.

Figure 6:
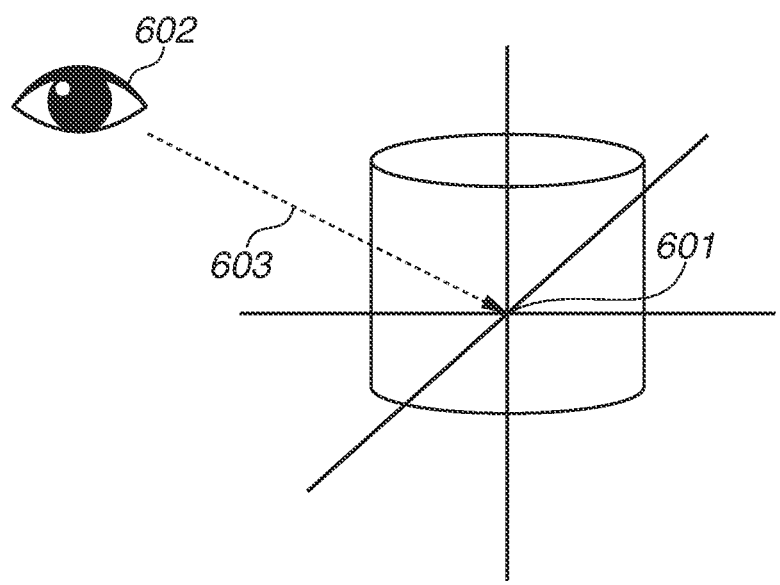
FIG. 6 is a diagram illustrating a front position of 3D model data according to one or more aspects of the present disclosure.

The item "front position" indicates a coordinate value representing the front of the 3D model data identified by the "model ID". FIG. 6 is a diagram illustrating the front position of the 3D model data.

For example, the "front position" in Table 2 indicates a coordinate position (603) of an intersection of a line connecting a center position 601 and an observation position 602 of the 3D model data with a surface of the 3D model data or the model object as illustrated in FIG. 6.

Table 3 is a table illustrating an example of modeling permit information for each 3D model data managed by the model data management unit 503 for each user.

TABLE 3

| MODEL ID | DATA AVAILABILITY | MODELING LIMIT NUMBER |
|---|---|---|
| M0001 | AVAILABLE | U0001:5 |
|  |  | U0002:10 |
| M0002 | UNAVAILABLE | — |
| M0003 | AVAILABLE | U0001:0 |
| ... | ... | ... |

In Table 3, an item "model ID" is similar to the model ID in Table 2.

An item "data availability" indicates whether modeling based on the 3D model data identified by the "model ID" is permitted by an owner of the corresponding 3D model data. When the "data availability" is "available", modeling based on the corresponding 3D model data is permissible.

An item "modeling limit number" is information which indicates an allowable number of times of modeling based on the 3D model data identified by the "model ID", and is retained for each user. According to the example of Table 3, modeling based on 3D model data corresponding to model ID "M0001" is allowed up to five times for a user of user ID "U0001", and up to ten times for a user of user ID "U0002". These values are changed for each modeling, and the changed values are retained. The number of times of use may be counted and separately retained as another value, instead of reducing the "modeling limit number". In this case, whether the number of times of use exceeds the modeling limit number is checked at the time of checking availability or unavailability of 3D model data described below.

Figure 7:
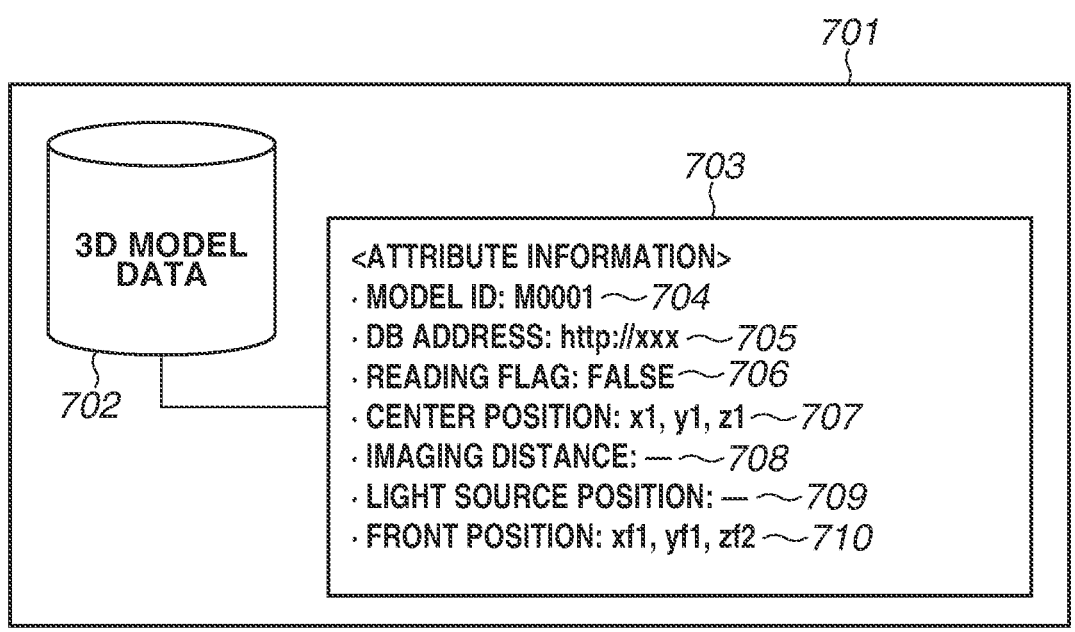
FIG. 7 is a diagram illustrating an example of 3D model data generated employing a dedicated application according to one or more aspects of the present disclosure.

FIG. 7 is a diagram illustrating an example of 3D model data generated under a dedicated application.

Data package 701 generated under the not illustrated dedicated application includes 3D model data 702, and attribute information 703 associated with the 3D model data 702 (information indicated in Table 2).

The attribute information 703 includes information items about a model ID 704, a DB address 705, a reading flag 706, a center position 707, an imaging distance 708, a light source position 709, and a front position 710. Each item of the information is determined at the time of generation of the 3D model data 702 employing the dedicated application or the like, and retained as the attribute information 703. The 3D model data 702 illustrated in FIG. 7 is not data generated by the reading device 103. Accordingly, the 3D model data 702 includes the reading flag 706 indicating "FALSE", and the imaging distance 708 and the light source position 709 indicating no information.

While the 3D model data 702 and the attribute information 703 are packaged in the example of the data package 701 illustrated in FIG. 7, an exemplary embodiment of the present disclosure may be implemented by using 3D model data containing attribute information in an extended data structure of the 3D model data. According to the present exemplary embodiment, extended 3D model data containing attribute information, and the data package illustrated in FIG. 7 are collectively referred to as (3D model) management model data.

Figure 8:
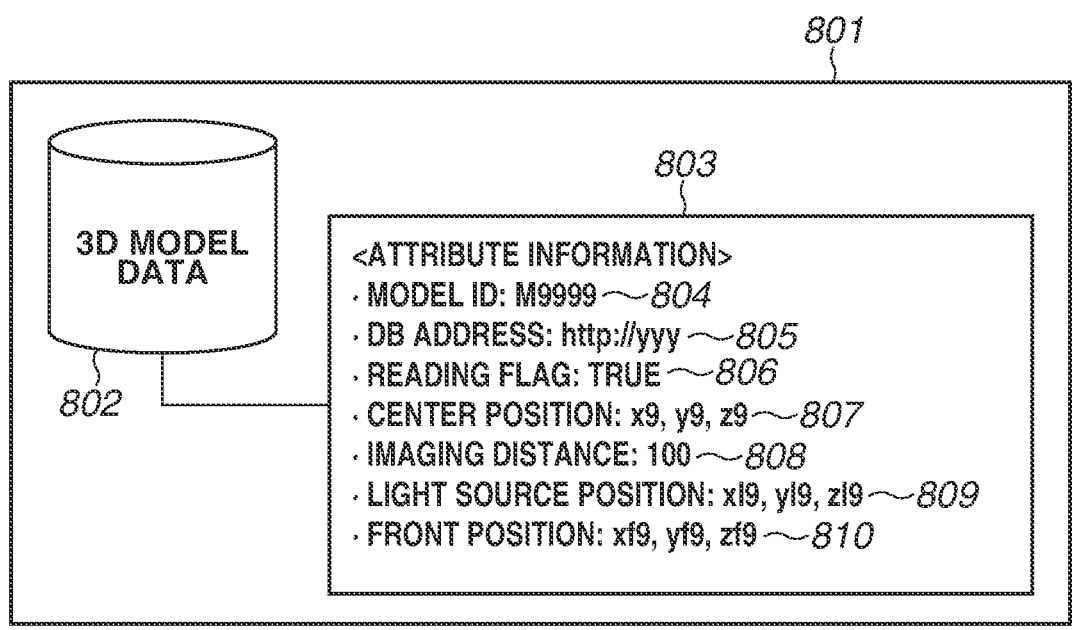
FIG. 8 is a diagram illustrating an example of 3D model data generated by a reading device according to one or more aspects of the present disclosure.

FIG. 8 is a diagram illustrating an example of 3D model data generated by the reading device 103.

Data package 801 generated by the reading device 103 includes 3D model data 802 and attribute information 803 associated with the 3D model data 802. For example, the 3D model data 802 is data in standard triangulated language (STL) data format, which is model data including coordinate information corresponding to a three-dimensional object.

The attribute information 803 includes items about a model ID 804, a DB address 805, a reading flag 806, a center position 807, an imaging distance 808, a light source position 809, and a front position 810. Each of the respective items 804 through 810 of the attribute information 803 is determined at the time of generation of the 3D model data 802 by the reading device 103, and is retained as the attribute information 803. Each item of the attribute information 803 is similar to the corresponding item described with reference to Table 2, therefore, the same detailed description is not repeated herein. The 3D model data 802 illustrated in FIG. 8 is data generated by the reading device 103. Accordingly, the attribute information 803 retains the reading flag 806 indicating "TRUE", and the imaging distance 808 and the light source position 809 each indicating information at the time of imaging by the reading device 103.

In the attribute information 803, identification information indicating a reading device ID of the reading device 103 (e.g., vendor name, model information, and serial number) may be additionally defined. The added device ID can be used for tracking of a data distribution route, and may be utilized as an index for recognizing accuracy of the 3D model data 802 which is dependent on reading accuracy of the reading device 103. Moreover, in the attribute information 803, the number of times of use of the 3D model data 802 (number of times of modeling), and the modeling limit number may be additionally defined. The number of times of modeling is updated for each modeling based on the 3D model data 802.

Moreover, the attribute information 803 in the 3D management model data where information such as the reading flag 806 and the device ID is defined, may be utilized for recognition of a use status, such as a status that the corresponding data is secondary use data for an original object. According to an exemplary embodiment of the present disclosure, a further detailed use status is recognizable with reference to information about the DB address 805 included in the attribute information 803.

Figure 9:
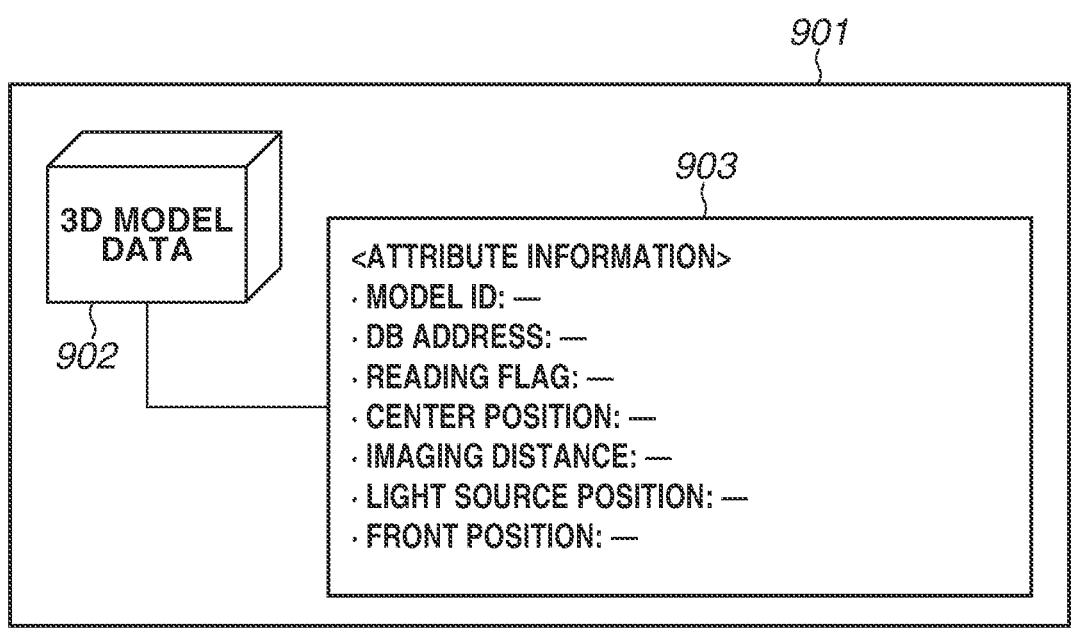
FIG. 9 is a diagram illustrating an example of 3D model data which includes no attribute information according to one or more aspects of the present disclosure.

FIG. 9 is a diagram illustrating an example of 3D model data including no attribute information.

Data package 901 illustrated in FIG. 9 includes 3D model data 902, and attribute information 903 associated with the 3D model data 902. However, the attribute information 903 includes no information. The data package in the format illustrated in FIG. 9 is used when the 3D model data 902 is generated without using a dedicated application for 3D model data creation or the reading device 103 and attribute information is omitted intentionally.

Figure 10:
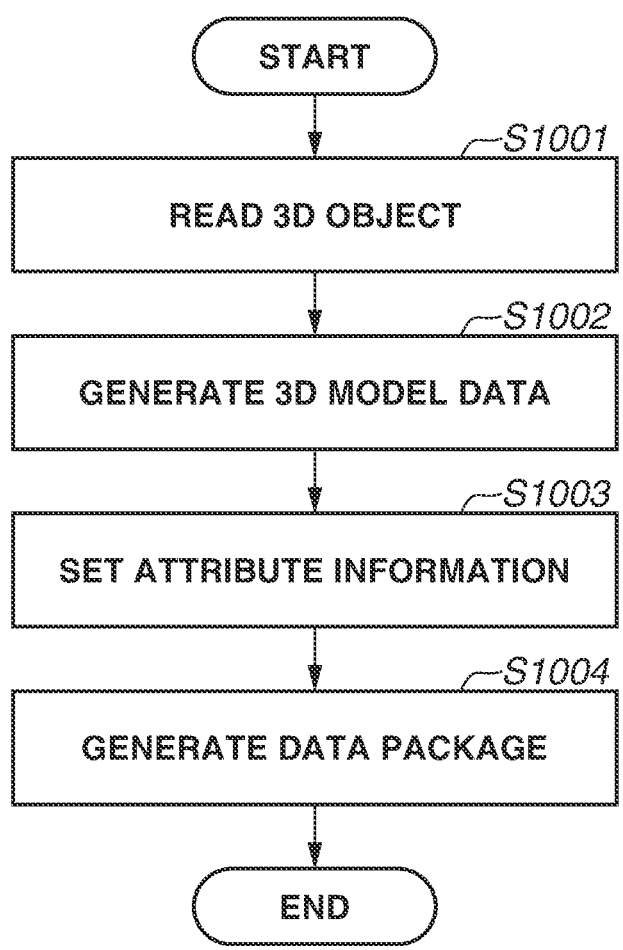
FIG. 10 is a flowchart illustrating a generation process performed by a reading device for generating data package according to one or more aspects of the present disclosure.

FIG. 10 is a flowchart illustrating an example of a generation process performed by the reading device 103 to generate data package. The process illustrated in this flowchart is implemented employing the reading control application 413 stored in the ROM 204 and executed by the CPU 203 included in the built-in computer 412 of the reading device 103.

When an instruction for executing the generation process is received from the UI 414 of the reading device 103 or the client PC 104 to generate the data package, the reading device 103 starts the process illustrated in this flowchart.

In step S1001, the imaging unit of the reading device 103 initially reads a reading target object.

In subsequent step S1002, the reading device 103 generates 3D model data based on imaging data read in step S1001. The 3D model data may be generated by the built-in computer 412 of the reading device 103. Alternatively, the imaging data read in step S1001 may be transmitted from the data transmission/reception unit 415 to the client PC 104 to generate 3D model data by the client PC 104.

In subsequent step S1003, the reading device 103 sets attribute information. The attribute information is information including items about a model ID, a DB address, a reading flag, a center position, an imaging distance, a light source position, and a front position as indicated in Table 2. When the generation process is performed by the reading device 103 to generate model data, the reading flag included in the attribute information is "TRUE". In addition, information acquired from the imaging unit, or values manually input by a user (manually input through UI 414 of reading device 103 or from client PC 104) are set as attribute information indicating the center position, the imaging distance, the light source position, and the front position.

In subsequent step S1004, the reading device 103 generates data package based on the 3D model data generated in step S1002, and the attribute information generated in step S1003. The generated data package is transmitted to the client PC 104, or stored in a recording medium connected to the external memory interface. The data package generated in this step is configured as illustrated in FIG. 8, for example.

The flowchart described above is a flowchart of the process performed by the reading device 103 for generating data package including 3D model data and attribute information. Attribute information in this flowchart may be set not only by the reading device 103, but also employing a reading application or a scan driver operating in the client PC 104.

Figure 11:
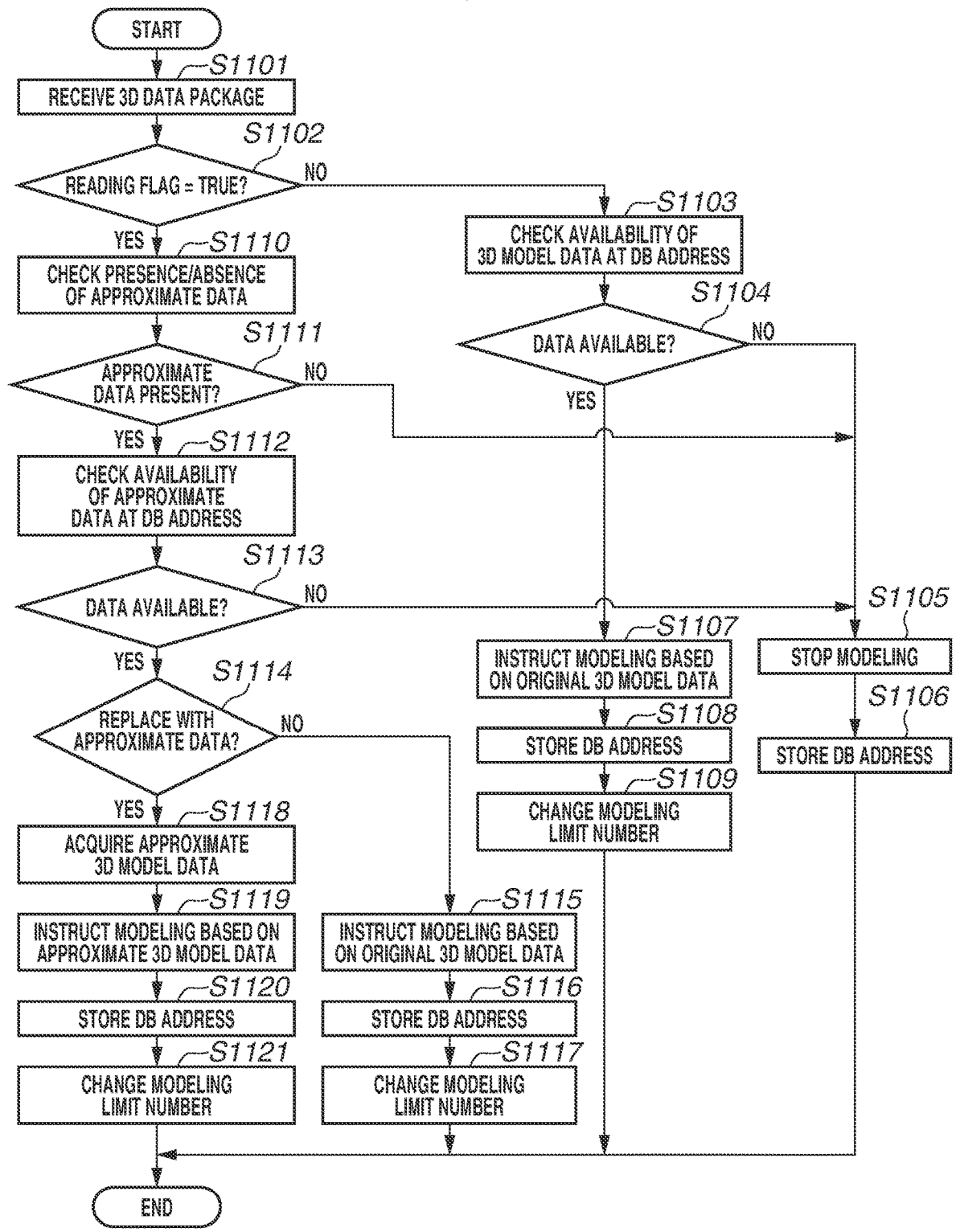
FIG. 11 is a flowchart illustrating a modeling process performed by a modeling device having received data package (including attribute information) according to one or more aspects of the present disclosure.

FIG. 11 is a flowchart illustrating an example of a modeling process performed by the modeling device 102 having received data package (including attribute information). This flowchart illustrates a modeling process performed by the modeling device 102 having received the data package 801 illustrated in FIG. 8 and transmitted from the client PC 104. The process illustrated in this flowchart is performed employing the modeling device control application 313 stored in the ROM 204 and executed by the CPU 203 included in the built-in computer 312 of the modeling device 102.

In step S1101, the modeling device 102 receives the data package 801 transmitted from the client PC 104, for example. The data package 801 may be input from a recording medium connected to an external interface of the modeling device 102. The modeling device 102 further acquires the 3D model data 802 and the attribute information 803 included in the received data package 801. The modeling device 102 further acquires detailed information included in the attribute information 803, i.e., the model ID 804, the DB address 805, the reading flag 806, the center position 807, the imaging distance 808, the light source position 809, and the front position 810.

In subsequent step S1102, the modeling device 102 refers to the reading flag 806 acquired in step S1101, and determines whether the reading flag 806 is "TRUE". When the modeling device 102 determines that the reading flag 806 is not "TRUE" (is "FALSE") (NO in step S1102), the processing proceeds to step S1103.

In step S1103, the modeling device 102 inquires of the DB 105 corresponding to the DB address 805 acquired in step S1101 to check availability of the 3D model data 802 acquired in step S1101.

The checking of availability in this step is carried out initially by transmitting, from the modeling device 102 to the DB 105, the model ID 804 acquired in step S1101, and the user ID and password of the user performing the modeling process. The user ID and password may be values retained in the storage area of the modeling device 102 beforehand, values input to the client PC 104 from the user at every modeling instruction and transmitted to the modeling device 102 together with the modeling instruction, or values input through the UI 314. The DB 105 determines availability of the 3D model data 802 for modeling based on the model ID 804 received from the modeling device 102, and information about the user ID and password. Initially, the user management unit 502 of the DB 105 checks whether the user is a registered user, and whether the password is correct based on the received user ID and password. When it is determined that the user is not a registered user or that the password is incorrect, the DB 105 transmits information indicating unavailability of the 3D model data 802 to the modeling device 102. On the other hand, when it is determined that the user is a registered user and that the password is correct, the model data management unit 503 determines availability or unavailability of the 3D model data 802. Thereafter, the DB 105 transmits information indicating availability of the 3D model data to the modeling device 102. For example, suppose that availability or unavailability of the 3D model data is managed under the table illustrated in Table 3. When the model ID 804 and the user ID transmitted from the modeling device 102 are "M0001" and "U0002", respectively, modeling based on the 3D model data 802 is determined as "permissible". In this case, the DB 105 transmits information indicating availability of the 3D model data 802 to the modeling device 102.

In subsequent step S1104, the modeling device 102 refers to availability/unavailability information about the 3D model data 802 checked in step S1103 to determine whether the 3D model data 802 is available. When it is determined that the 3D model data 802 is not "available" (NO in step S1104), the processing proceeds to step S1105.

In step S1105, the modeling device 102 stops modeling. As described above, the modeling device 102 accesses the DB 105 with reference to the DB address 805 included in the attribute information 803 to limit modeling based on the use status of the 3D model data 802.

In subsequent step S1106, the modeling device 102 retains the DB address 805 of the attribute information acquired in step S1101 in the secondary storage device 206 of the modeling device 102 via the data retention unit 317 of the modeling device 102. The DB address 805 retained in the secondary storage device 206 of the modeling device 102 is an address used in an exemplary embodiment illustrated in FIG. 12 described below.

After the process in step S1106, the modeling device 102 ends the processing of this flowchart.

On the other hand, when the modeling device 102 determines in step S1103 that the 3D model data 802 acquired in step S1101 is "available" (YES in step S1104), the processing proceeds to step S1107.

In step S1107, the hardware control unit 316 of the modeling device 102 instructs the hardware unit 311 to perform modeling based on the 3D model data 802 acquired in step S1101.

After completion of the modeling instructed in step S1107, the modeling device 102 in step S1108 retains the DB address 805 of the attribute information acquired in step S1101 in the secondary storage device 206 of the modeling device 102 via the data retention unit 317 of the modeling device 102.

In subsequent step S1109, the modeling device 102 changes the modeling limit number of the 3D model data used for modeling. More specifically, the modeling device 102 transmits, to the DB 105, information notifying modeling completion, the model ID 804 of the 3D model data used for modeling, and the user ID of the user having performed the modeling process. The DB 105 changes the modeling limit number based on the received model ID 804 and user ID. For example, suppose that availability or unavailability of 3D model data is managed under the table illustrated in Table 3. When the model ID and the user ID transmitted from the modeling device 102 are "M0001" and "U0002", respectively, the modeling limit number is changed from "10" to "9".

After the process in step S1109, the modeling device 102 ends the processing of this flowchart.

When the modeling device 102 determines in step S1102 that the reading flag 806 is "TRUE" (YES in step S1102), the processing proceeds to step S1110.

In step S1110, the modeling device 102 checks presence or absence of approximate data for the 3D model data 802 acquired in step S1101. The checking of presence or absence of approximate data is carried out initially by transmitting, from the modeling device 102 to the DB 105, the 3D model data 802 and the attribute information 803 acquired in step S1101. Based on the received 3D model data 802 and attribute information 803, the DB 105 checks whether 3D model data similar to the received model data is present in respective sets of 3D model data managed by the DB 105.

An example of the foregoing checking process performed by the DB 105 is hereinafter described.

Initially, the DB 105 searches for, from the 3D model data 504, 3D model data which has the same center position and front position of attribute information, or 3D model data whose absolute values of coordinate position differences in center position and front position are equal to or smaller than a certain threshold based on search conditions of the center position and the front position. When 3D model data meeting the search conditions is absent, the DB 105 determines that "approximate data is absent", and ends the checking process.

On the other hand, when it is determined that 3D model data meeting the search conditions is present, the DB 105 calculates a difference of arbitrary coordination position between the 3D model data 802 and the searched 3D model data in a state that the center positions and the front positions of these data are aligned. In this case, the scale of the 3D model data 802 is changed before calculation of the differences in consideration of the imaging distance. Thereafter, the DB 105 designates the 3D model data as approximate data when the sum of the calculated coordinate position differences is equal to or smaller than a certain threshold. If plural pieces of approximate data are found, the DB 105 designates the 3D model data indicating the smallest sum as representative approximate data.

On the other hand, in a case of absence of 3D model data whose calculated coordinate position differences are equal to or smaller than a certain threshold, the DB 105 performs a following process in consideration of the light source position. The DB 105 calculates also a sum of differences in a case where a difference of a coordinate position of a part estimated to have been difficult to read in detail under presence of a shadow is deemed as "zero", and designates the 3D model data as approximate data when the sum of differences is equal to or smaller than a certain threshold. When 3D model data indicating a value equal to or smaller than the threshold is absent even in the process which gives consideration to the light source position, the DB 105 determines that "approximate data is absent", and transmits this information to the modeling device 102. On the other hand, when 3D model data designated as approximate data is present in the process which gives consideration to the light source position, the DB 105 transmits information indicating that "approximate data is absent", and the model ID of the (representative) approximate data to the modeling device 102. Accordingly, the modeling device 102 comes to be able to acquire approximate data.

The checking process described above is an example of a process for checking presence or absence of approximate data based on comparison between three-dimensional coordinate positions of 3D model data. Alternatively, the presence or absence of approximate data may be checked based on comparison between two-dimensional images, for example. In a case of comparison between two-dimensional images, a two-dimensional image having a direction determined beforehand is retained for each 3D model data present in the DB 105. In addition, a two-dimensional image having the same direction is generated at the time of acquisition of 3D model data in step S1101. Comparison is made between the two-dimensional images for each direction. Differences between the respective images are calculated based on the comparison to allow similar checking of presence or absence of approximate data. The foregoing processes for checking presence or absence of approximate data are presented only by way of example. Any processing methods may be adopted as long as approximation of 3D model data can be checked.

In subsequent step S1111, the modeling device 102 refers to information indicating presence or absence of approximate data checked in step S1110 to determine whether approximate data is present. When the modeling device 102 determines that approximate data is absent (NO in step S1111), the processing proceeds to step S1105. Processes from step S1105 are similar to the corresponding processes described above.

On the other hand, when the modeling device 102 determines that approximate data is present (YES in step S1111), the processing proceeds to step S1112.

In step S1112, the modeling device 102 inquires of the DB 105 about availability or unavailability of the approximate data acquired in step S1110. More specifically, the modeling device 102 transmits the model ID of the acquired approximate data, the user ID and password of the user performing the modeling process to the DB 105. The user ID and password are values retained in the storage area of the modeling device 102 beforehand, values input to the client PC 104 from the user at every modeling instruction and transmitted to the modeling device 102 together with the modeling instruction, or values input through the UI 314. The DB 105 determines availability or unavailability of the approximate data based on the model ID of the approximate data, information about the user ID and password received from the modeling device 102. Initially, the user management unit 502 of the DB 105 checks whether the user is a registered user, and whether the password is correct based on the received user ID and password. When it is determined that the user is not a registered user or that the password is incorrect, the DB 105 transmits information indicating unavailability of the approximate data to the modeling device 102. On the other hand, when the user is a registered user and the password is correct, the model data management unit 503 determines availability or unavailability of the approximate data 802. Thereafter, the DB 105 transmits information indicating availability of the 3D model data to the modeling device 102. For example, suppose that availability or unavailability of 3D model data is managed under the table illustrated in Table 3. When the model ID of the approximate data and the user ID transmitted from the modeling device 102 are "M0001" and "U0002", respectively, the DB 105 determines that modeling based on the approximate data is "permissible". In this case, the DB 105 transmits information indicating availability of the approximate data to the modeling device 102.

In step S1113, the modeling device 102 refers to the availability/unavailability information about the approximate data checked in step S1112 to determine whether the approximate data is available. When the modeling device 102 determines that the approximate data is unavailable (NO in step S1113), the processing proceeds to step S1105. Processes from step S1105 are similar to the corresponding processes described above.

On the other hand, when the modeling device 102 determines that the approximate data is available (YES in step S1113), the processing proceeds to step S1114.

In step S1114, the modeling device 102 displays a confirmation window for checking whether to replace the 3D model data 802 acquired in step S1101 with the approximate data to carry out the modeling (e.g., FIG. 13), and determines whether to replace the 3D model data 802 with the approximate data for modeling based on an instruction received through the confirmation window.

FIG. 13 is a view illustrating an example of a confirmation window for checking whether to replace the 3D model data with approximate data to carry out the modeling. This confirmation window is displayed on an operation unit of the client PC 104 in a case of 3D data package received from the client PC 104, or is displayed in the UI 314 of the modeling device 102 in a case of 3D data package input from a recording medium connected to the external interface of the modeling device 102. When the confirmation window is displayed on the client PC 104, a result of selection input from the user to the client PC 104 is transmitted to the modeling device 102.

When the user operates a "NO" button in the selection window to select no replacement with the approximate data, the modeling device 102 does not determine replacement with the approximate data (NO in step S1114). In this case, the processing proceeds to step S1115.

In step S1115, the hardware control unit 316 of the modeling device 102 instructs the hardware unit 311 to perform modeling based on the 3D model data 802 acquired in step S1101.

After completion of the modeling instructed in step S1115, the modeling device 102 in step S1116 retains the DB address 805 of the attribute information acquired in step S1101 in the secondary storage device via the data retention unit 317 of the modeling device 102.

In step S1117, the modeling device 102 changes the modeling limit number of the 3D model data used for modeling. Details of the process executed in this step are similar to the corresponding details in step S1109.

After the process in step S1117, the modeling device 102 ends the processing of this flowchart.

On the other hand, when the user presses a "YES" button in the selection window in step S1114 to select replacement with the approximate data, the modeling device 102 determines replacement with the approximate data (YES in step S1114). In this case, the processing proceeds to step S1118.

In step S1118, the modeling device 102 acquires approximate data from the DB 105. The approximate data to be acquired in this step is 3D model data acquired in step S1110 and corresponding to the model ID determined as (representative) approximate data by the DB 105.

In subsequent step S1119, the hardware control unit 316 of the modeling device 102 instructs the hardware unit 311 to perform modeling based on the 3D model data acquired in step S1118.

After completion of modeling instructed in step S1119, the modeling device 102 in step S1120 retains the DB address 805 of the attribute information acquired in step S1101 in the secondary storage device via the data retention unit 317 of the modeling device 102.

In subsequent step S1121, the modeling device 102 changes the modeling limit number of the 3D model data used for modeling. More specifically, the modeling device 102 transmits information notifying completion of modeling, the model ID of the approximate data used for modeling, and the user ID of the user having performed the modeling process, to the DB 105. The DB 105 changes the modeling limit number based on the received model ID and user ID. For example, suppose that availability or unavailability of the 3D model data is managed under the table illustrated in Table 3. When the model ID and the user ID transmitted from the modeling device 102 are "M0001" and "U0002", respectively, the modeling limit number is changed from "10" to "9".

After the process in step S1121, the modeling device 102 ends the processing of this flowchart.

The processing illustrated in FIG. 11 described above performs the modeling according to attribute information about 3D model data. Accordingly, copying and modeling of copyrighted objects or dangerous objects are avoidable. Moreover, accuracy of a model object allowed to be copied becomes equivalent to accuracy of an original model object. Furthermore, the use frequency (number of times of use) of copying data of a model object allowed to be copied can be recognized.

Figure 12:
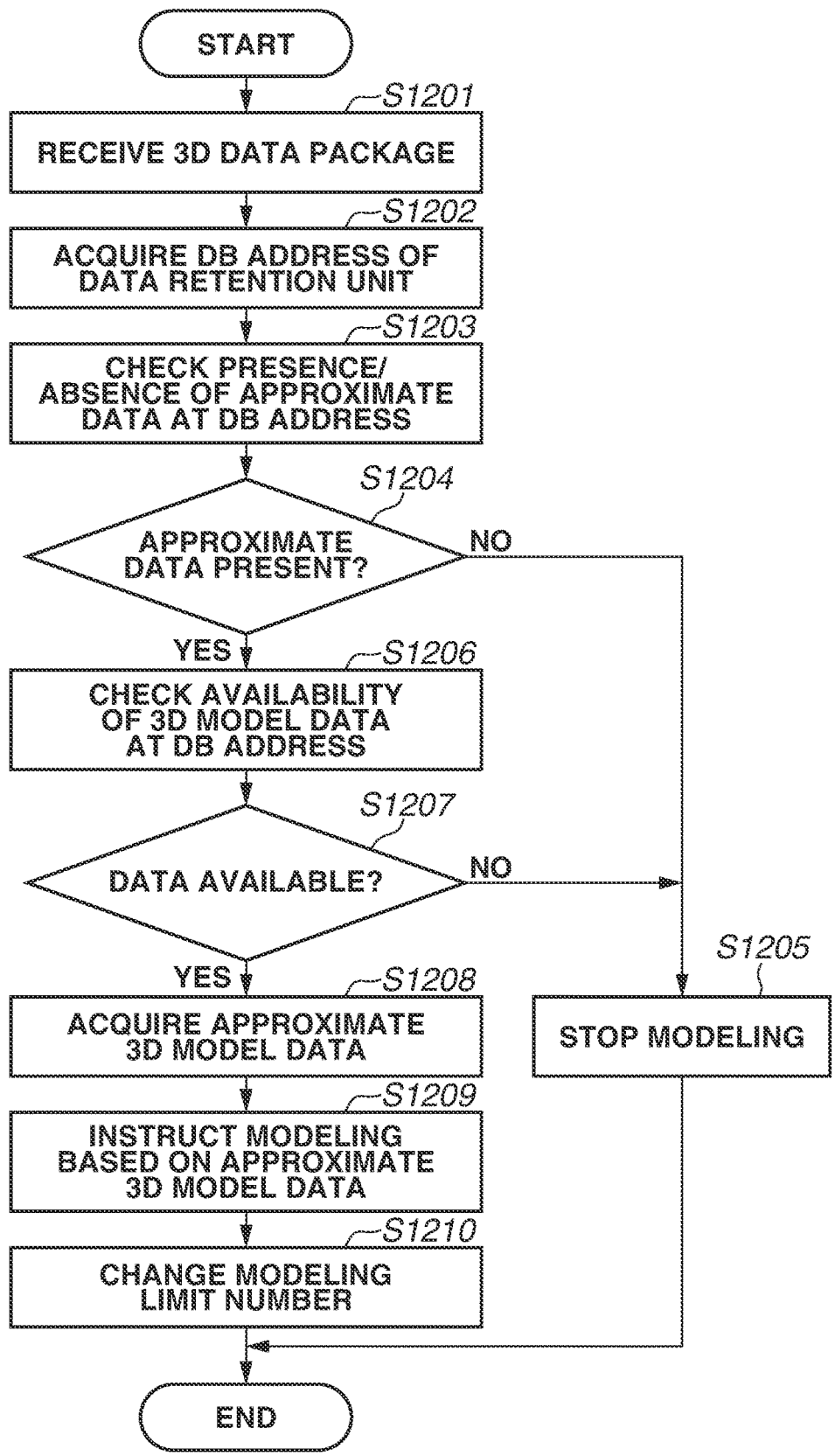
FIG. 12 is a flowchart illustrating a modeling process performed by a modeling device having received data package (not including attribute information) according to one or more aspects of the present disclosure.

FIG. 12 is a flowchart illustrating a modeling process performed by the modeling device 102 having received data package (including no attribute information). For example, this flowchart illustrates a modeling process performed by the modeling device 102 having received the data package 901 illustrated in FIG. 9 and transmitted from the client PC 104. The process illustrated in this flowchart is implemented employing the modeling device control application 313 stored in the ROM 204 and executed by the CPU 203 included in the built-in computer 312 of the modeling device 102.

In step S1201, the modeling device 102 receives the data package 901 transmitted from the client PC 104, for example. The data package 901 may be input from a recording medium connected to the external interface of the modeling device 102. The attribute information 903 of the data package 901 does not include detailed information as illustrated in FIG. 9. Accordingly, detailed information is not acquirable.

In subsequent step S1202, the modeling device 102 acquires information about DB addresses retained in the data retention unit 317. This information corresponds to a list of DB addresses stored in step S1106, step S1108, and step S1114 of the flow illustrated in FIG. 11.

In subsequent step S1203, the modeling device 102 inquires of the DB 105 present onward from the DB address acquired in step S1202 to check presence or absence of approximate data for the 3D model data 902 acquired in step S1201. The process for checking the presence or absence of approximate data is similar to the process in step S1109 in FIG. 11, The checking is performed in a manner similar to the checking in step S1109 in FIG. 11, however, detailed information about the attribute information 903 included in the received 3D model data 902 is absent in the flowchart illustrated in FIG. 12, so that the presence or absence of approximate data is checked without attribute information. For example, concerning the process in step S1109 in FIG. 11, the center position, the front position, and the imaging distance are unknown in this example, so that alignment is impossible based on these items of information. In this case, the DB 105 calculates a difference of an arbitrary coordinate position while changing angles and positions of one 3D model data of comparison targets in x, y, and z planes at fixed intervals. In addition, the light source position is unknown, so that the checking of presence or absence of approximate data in consideration of a shadow during imaging is not carried out. It is determined that the 3D model data is approximate data when the sum of differences of calculated coordinate positions is equal to or smaller than a certain threshold. If plural pieces of approximate data are found, the 3D model data indicating the smallest sum of differences is designated as representative approximate data. On the other hand, in a case of absence of the foregoing 3D model data whose calculated coordinate position differences are equal to or smaller than the certain thresholds, the DB 105 transmits information indicating "no approximate data" to the modeling device 102. In a case of presence of 3D model data designated as approximate data as described above, the DB 105 transmits information indicating that "approximate data is present", and the model ID of the approximate data to the modeling device 102.

In subsequent step S1204, the modeling device 102 refers to the information indicating presence or absence of approximate data checked in step S1203 to determine whether approximate data is present. When the modeling device 102 determines that approximate data is absent (NO in step S1204), the processing proceeds to step S1205.

In step S1205, the modeling device 102 stops the modeling process, and ends the processing of this flowchart.

On the other hand, when the modeling device 102 determines that approximate data is present (YES in step S1204), the processing proceeds to step S1206.

In step S1206, the modeling device 102 inquires of the DB 105 present onward from the DB address acquired in step S1202 to check availability of the approximate data checked in step S1204. The checking of availability in this step is performed initially by transmitting, from the modeling device 102 to the DB 105, the model ID of the approximate data acquired in step S1204, and the user ID and password of the user performing the modeling process. The user ID and password are values retained in the storage area of the modeling device 102 beforehand, values input to the client PC 104 from the user at every modeling instruction and transmitted to the modeling device 102 together with the modeling instruction, or values input through the UI 314. The DB 105 determines whether use of the 3D model data for modeling is permitted based on the received information about the model ID, the user ID, and the password. Initially, the user management unit 502 of the DB 105 checks whether the user is a registered user, and whether the password is correct based on the received user ID and password. When it is determined that the user is not a registered user or that the password is incorrect, the DB 105 transmits information indicating unavailability of the 3D model data to the modeling device 102. When it is determined that the user is a registered user and the password is correct, the model data management unit 503 determines availability or unavailability of the 3D model data. Thereafter, the DB 105 transmits information indicating availability of the 3D model data to the modeling device 102.

In step S1207, the modeling device 102 refers to the availability/unavailability information about the approximate data checked in step S1206 to determine whether the approximate data is available. When the modeling device 102 determines that the approximate data is unavailable (NO in step S1207), the processing proceeds to step S1205. Processes from step S1205 are similar to the corresponding processes described above.

On the other hand, when the modeling device 102 determines that the approximate data is available (YES in step S1207), the processing proceeds to step S1208.

In step S1208, the modeling device 102 acquires 3D model data corresponding to the approximate data from the DB 105. The modeling device 102 identifies the 3D model data based on the model ID acquired in step S1204 to acquire the 3D model data.

In step S1209, the hardware control unit 316 of the modeling device 102 instructs the hardware unit 311 to perform modeling based on the 3D model data acquired in step S1209.

After completion of the modeling instructed in step S1209, the modeling device 102 in step S1210 changes the modeling limit number of the 3D model data used for modeling. More specifically, the modeling device 102 transmits information that notifies completion of modeling, the model ID of the approximate data used for modeling, and the user ID of the user having performed the modeling process, to the DB 105. The DB 105 changes the modeling limit number based on the received model ID and user ID. For example, suppose that availability or unavailability of 3D model data is managed under the table illustrated in Table 3. When the model ID and the user ID transmitted from the modeling device 102 are "M0001" and "U0002", respectively, the modeling limit number is changed from "10" to "9".

After the process in step S1210, the modeling device 102 ends the processing of this flowchart.

According to the processing performed as described above with reference to FIG. 12, copying and modeling of copyrighted objects or dangerous objects can be avoided even if attribute information associated with 3D model data does not exist. Moreover, a copy of a model object allowed to be copied can be modeled with the same accuracy as an original model object. Furthermore, the use frequency (number of times of use) of copying data of a model object allowed to be copied is recognizable.

A secondary exemplary embodiment is hereinafter described. According to the first exemplary embodiment, the reading device 103 sets new attribute information in step S1003 in FIG. 10 in order to generate 3D model data based on read imaging data and generate management model data.

However, the reading device 103 may additionally include a system for accessing a DB address and inquiring about presence of read imaging data, or (original) data approximate to a value set by the user. When it is determined that target data is present and attribute information corresponding to the data is present, at least a part of the attribute information (e.g., model ID, front position) may be set in the process of step S1003 in FIG. 10.

While the items of information about the center position, imaging distance, light source position, and front position are provided as feature values associated with a three-dimensional structure of corresponding 3D model data in the above description, the feature values are not limited to these items of information but may be other items of information.

As described above, according to the respective exemplary embodiments, data used for modeling a three-dimensionally model object is managed in such a manner that a usage situation of the data, such as identification, the number of times of use, and the generation route, are recognizable. Accordingly, copying and modeling of copyrighted objects or dangerous objects can be avoided. Moreover, a copy of a model object allowed to be copied can be modeled with the same accuracy as an original model object. Furthermore, the use frequency (number of times of use) of copying data of a model object allowed to be copied is recognizable.

Configurations and contents of various types of data are not limited to those described above, but other various configurations and contents may be employed depending on uses and purposes.

The present disclosure has been described above based on one or more aspects of exemplary embodiments, but the disclosure may be realized in the form of a system, a device, a method, a program, or a storage medium, for example. More specifically, the present disclosure is applicable to a system including a plurality of devices, or to an apparatus constituted by one device.

Any combinations of the respective exemplary embodiments described above are included in the scope of the present disclosure.

Other Embodiments

Embodiment(s) of the present disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors and one or more memories (e.g., central processing unit (CPU), micro processing unit (MPU)), and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of priority from Japanese Patent Application No. 2016-193046, filed Sep. 30, 2016, which is hereby incorporated by reference herein in its entirety.

What is claimed is:

1. An information processing apparatus comprising:
one or more memories storing instructions; and
one or more processors which, when executing the instructions, causes the information processing apparatus to generate management model data which includes model data available for modeling a three-dimensional object, and attribute information associated with the model data,
wherein the attribute information includes identification information about the model data, identification information related to a reading device that has read a three-dimensional object, generated data which indicates a three-dimensional structure of the object, and URL as address information for accessing an external system on the Internet, wherein the generated data is used for the model data, and wherein the identification information related to the reading device includes at least one of vendor name, model information, and serial number of the reading device.

2. The information processing apparatus according to claim 1, wherein the external system manages a usage situation of the model data, and wherein the address information is used by a three-dimensional printer to access the external system when modeling based on the model data is performed.

3. The information processing apparatus according to claim 1, wherein the attribute information further includes a number of times of use of the model data.

4. The information processing apparatus according to claim 1, wherein the identification information included in the attribute information and related to the reading device includes information indicating whether the model data is data generated by the reading device.

5. The information processing apparatus according to claim 1, wherein the model data includes coordinate information associated with a three-dimensional object.

6. The information processing apparatus according to claim 1, wherein the management model data is a data package including model data and attribute information associated with the model data.

7. The information processing apparatus according to claim 1, wherein the attribute information further includes a feature value related to the three-dimensional structure of the object.

8. The information processing apparatus according to claim 1, wherein the information processing apparatus is a three-dimensional scanner which has the reading device.

9. The information processing apparatus according to claim 1, wherein the attribute information is usable for control of a three-dimensional printer which performs modeling based on the model data.

10. The information processing apparatus according to claim 9, wherein the three-dimensional printer is controlled such that modeling by the three-dimensional printer is limited based on a usage situation of the model data.

11. The information processing apparatus according to claim 1, wherein the attribute information includes a feature value related to the three-dimensional structure of the object, wherein the identification information related to the reading device includes information indicating whether the model data is data generated by the reading device, and wherein data approximate to the feature value can be obtained from the external system when the identification information related to the reading device indicates that the model data is data generated by the reading device.

12. The information processing apparatus according to claim 1, wherein the instructions further cause the information processing apparatus to check availability of the model data by using the attribute information of the model data.

13. A method for an information processing apparatus, the method comprising:

generating management model data which includes model data available for modeling a three-dimensional object, and attribute information associated with the model data, wherein the attribute information includes identification information about the model data, identification information related to a reading device that has read a three-dimensional object, generated data which indicates a three-dimensional structure of the object, and URL as address information for accessing an external system on the Internet, wherein the generated data is used for the model data, and wherein the identification information related to the reading device includes at least one of vendor name, model information, and serial number of the reading device.

14. A non-transitory computer readable storage medium storing a computer program for making a computer execute a method for an information processing apparatus, the method comprising:

generating management model data which includes model data available for modeling a three-dimensional object, and attribute information associated with the model data, wherein the attribute information includes identification information about the model data, identification information related to a reading device that has read a three-dimensional object, generated data which indicates a three-dimensional structure of the object, and URL as address information for accessing an external system on the Internet, wherein the generated data is used for the model data, and wherein the identification information related to the reading device includes at least one of vendor name, model information, and serial number of the reading device.

* * * * *